United States Patent [19]

Yajima

[11] Patent Number: 5,777,358
[45] Date of Patent: Jul. 7, 1998

[54] STACKED CAPACITOR SEMICONDUCTOR MEMORY DEVICE AND METHOD FOR FABRICATING THE SAME

[75] Inventor: Takashi Yajima, Tokyo, Japan

[73] Assignee: NEC Corporation, Tokyo, Japan

[21] Appl. No.: 535,857

[22] Filed: Sep. 28, 1995

[30] Foreign Application Priority Data

Sep. 28, 1994 [JP] Japan ................... 6-258937

[51] Int. Cl.$^6$ .................. H01L 27/108; H01L 29/76; H01L 29/94; H01L 31/119
[52] U.S. Cl. .................. 257/306; 257/311; 257/324; 257/377
[58] Field of Search .................. 257/278, 303, 257/306, 311, 324, 377, 532, 635

[56] References Cited

U.S. PATENT DOCUMENTS

| | | | |
|---|---|---|---|
| 5,196,910 | 3/1993 | Moriuchi et al. | 257/296 |
| 5,406,103 | 4/1995 | Ogawa | 257/306 |
| 5,604,365 | 2/1997 | Kajigaya et al. | 257/296 |

FOREIGN PATENT DOCUMENTS

| | | | |
|---|---|---|---|
| 2253937 A | 9/1992 | Japan | 257/306 |

*Primary Examiner*—Wael Fahmy
*Assistant Examiner*—Howard Weiss
*Attorney, Agent, or Firm*—Young & Thompson

[57] ABSTRACT

A novel structure of a semiconductor memory device on a silicon substrate comprising: a first area on which stacked capacitor memory cells comprising top and bottom electrodes sandwiching a dielectric film are formed; a second area including at least a contact hole in which at least a wiring layer is formed; and a plurality of inter-layer insulators extending over both the first and second areas, wherein: the a plurality of inter-layer insulators have two different total thickness between the first and second areas so that the total thickness on the first area is larger than that on the second area to thereby sufficiently reduce an aspect ratio of the at least a contact hole on the second area for allowing the wiring layer in the contact hole to have a good step coverage as well as allowing a top inter-layer insulator to have a gentle slope with a good step coverage at a boundary between the first and second areas.

4 Claims, 5 Drawing Sheets

STACKED CAPACITOR SEMICONDUCTOR MEMORY DEVICE AND METHOD FOR FABRICATING THE SAME

BACKGROUND OF THE INVENTION

The present invention relates to a semiconductor memory device having stacked capacitor memory cells and method for fabricating the same.

A high integration of the semiconductor memory device has been promoted increasingly by introducing a three dimensional memory cell capacitor structure such as a stacked capacitor structure. One of the conventional semiconductor memory cell devices was proposed in IEEE Transaction on Electron Devices, Vol. ED-27, No. 8, Aug. 1980, pp. 1596–1601.

Figure 1:
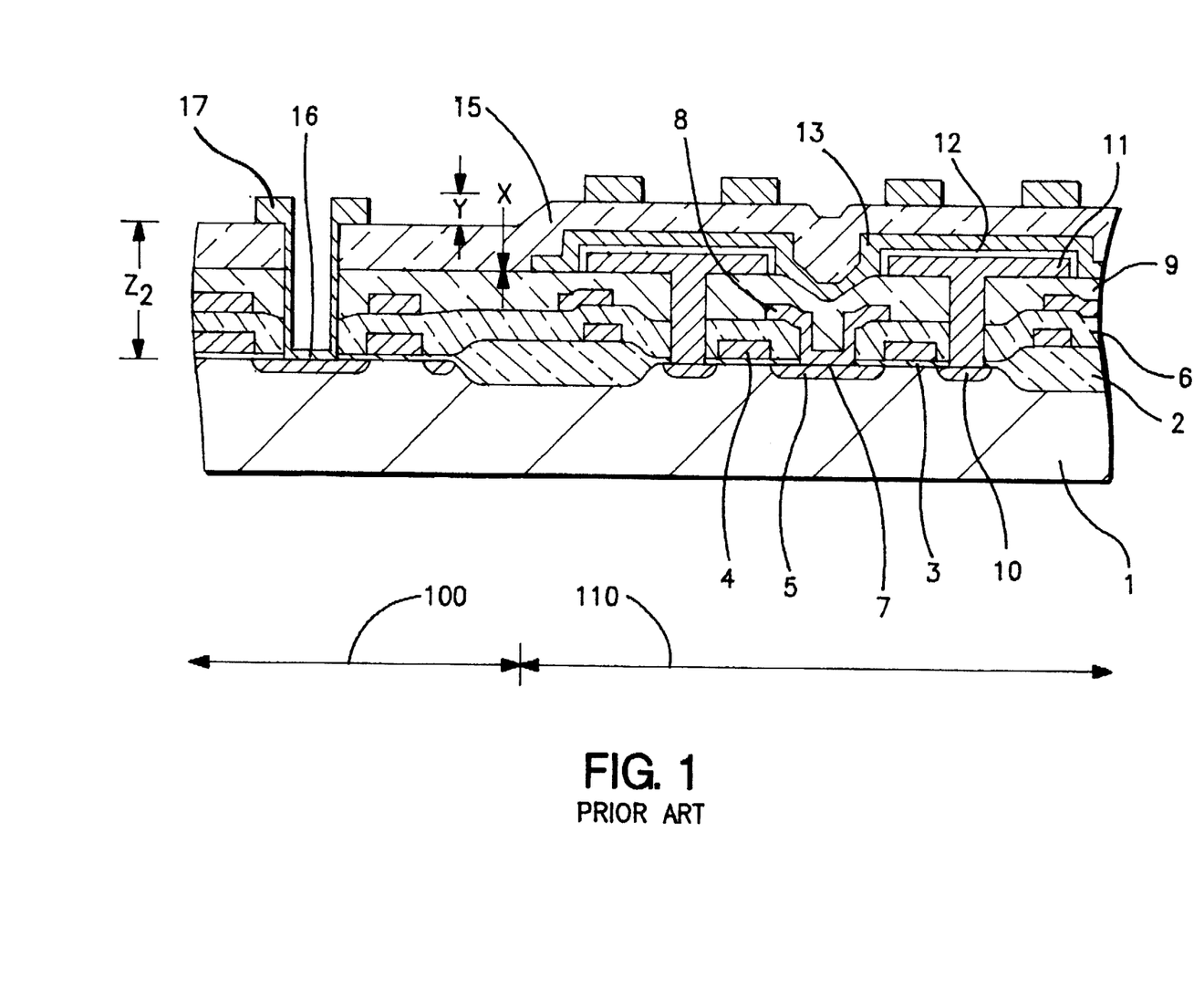
FIG. 1 is a fragmentary cross sectional elevation view illustrative of the conventional stacked capacitor memory cell array structure.

As illustrated in FIG. 1, field oxide films 2 are formed in a surface of a p-type silicon substrate 1 and then a gate oxide film 3 and a first polysilicon layer are in turn grown thereon. A photo-lithography is used for patterning of the first polysilicon layer to form first wiring layers 4 on the gate oxide film. The first wiring layers 4 act as word lines of the memory cells.

The first wiring layers 4 and the field oxide films 2 are used as masks for n-type impurity ion implantation such as phosphorus implantation to form n+-diffusion layers 5 serving as source/drain diffusion layers. A first inter-layer insulator 6 is formed on an entire surface of the device. First contact holes 7 are selectively formed in the first inter-layer insulator 6 so that the first contact holes 7 are positioned over part of the n+-type diffusion layers 5. Second wiring lines 8 are formed within and the vicinity of the first contact holes so that the second wiring lines 8 are in contact with the n+-type diffusion layers, wherein the second wiring lines 8 act as bit lines.

A second inter-layer insulator 9 is formed on an entire surface of the device. Second contact holes 10 are formed in the first and second inter-layer insulators 6 and 9 so that the second contact holes 10 are positioned over the remaining part of the n+-type diffusion layers 5. A second polysilicon film is formed on an entire surface of the device so that the second polysilicon film is formed within the second contact hole thereby the second polysilicon film is in contact with the remaining part of the diffusion layers, resulting in a formation of bottom electrodes 11 of stacked capacitors. The bottom electrodes 11 of the stacked capacitor is in contact with the remaining part of the diffusion layers. A capacitive insulation film 12 is formed to cover the bottom electrodes 11 of the stacked capacitor. A top electrode 13 of the stacked capacitor are formed to cover the capacitive insulation film 12 thereby the stacked capacitor is formed. The top electrode 13 is formed to extend over an entire part of a memory cell area 110.

A third inter-layer insulator 15 is formed on an entire surface of the device. A third contact hole 16 is then formed through the first to third inter-layer insulators 6, 9 and 15 wherein the third contact hole 16 is positioned over the diffusion layer in a peripheral area 100. A third wiring layer 17 is formed on the third inter-layer insulator 15 as well as within and in the vicinity of the third contact hole 16 so that the third wiring layer 17 is in contact with the diffusion layer in the peripheral area 100.

The stacked capacitor is positioned over the word lines 4 and the bit lines 8 by enlargements in an area and a thickness of the bottom electrode of the stacked capacitor. As a result, the stacked capacitor is permitted to have an enlarged capacity, resulting in an improvement in stability of the operation of the semiconductor memory device. Even the bottom electrode of the stacked capacitor is required to be thick, the first contact hole 7 is permitted to have a small aspect ratio. This makes it easy to form the first contact hole 7 in the fabrication processes.

The above described conventional memory device has the following problems. The progression of the scaling down in horizontal directions which are strongly required as much as possible would result in an increase in the aspect ratio of the third contact hole 16 in the peripheral area 100. The increased aspect ratio of the contact hole provides a deterioration of a step coverage of the third wiring layer in the third contact hole 16. Namely, the third contact hole 16 has a small size which results in a large aspect ratio whereby the step coverage of the third wiring layer 17 is deteriorated, resulting in a disconnection of the third wiring layer 17. In 16MDRAM, the contact hole is formed to have a diameter of 0.6 micrometers and a height in the range of from 12000 to 14000 angstroms which corresponds to the total thickness of the first to third inter-layer insulators 6, 9 and 15. The aspect ratio of the third contact hole would be in the range from 2.0 to 2.3.

To settle the above problem, it may be proposed to reduce the total thickness of the first to third inter-layer insulators 6, 9 and 15 so that the height of the third contact hole 16 is reduced to relax the deterioration of the step coverage of the third contact hole. The reduction in the height of the third contact hole for having the third wiring layer 17 free from the deterioration of the step coverage would, however, provide another serious problem in increasing a difference "y" in level of a top surface of the third inter-layer insulator 15 between in the peripheral area 100 and in the memory cell array area 110. The increase in the level difference "y" of the third inter-layer insulator 15 due to the reduction of the total thickness of the first to third inter-layer insulators 6, 9 and 15 would provide a certain deterioration of the step coverage of the third inter-layer insulator 15 due to the large level difference of the third inter-layer insulator 15 at the boundary between the peripheral area 100 and the memory cell array area 110. This technique is disclosed in the Japanese Laid-open Patent Application No. 3-101132 and the Japanese Laid-open Patent Application No. 3-175150. To obtain the reduced total thickness of the first to third inter-layer insulators 6, 9 and 15 requires an additional photo-lithography process using a photo-resist mask thereby leading to a complication of the fabrication processes and an increase of the manufacturing cost.

It has, therefore, been required to develop a quite novel structure of the stacked capacitor memory cell array area structure free from any problems as described above.

SUMMARY OF THE INVENTION

Accordingly, it is an object of the present invention to provide a novel structure of the stacked capacitor memory cell array device free from any problems as described above.

It is a further object of the present invention to provide a novel structure of the stacked capacitor memory cell array device free from any problem with the deterioration of the step coverage of the inter-layer insulator.

It is a furthermore object of the present invention to provide a novel structure of the stacked capacitor memory cell array device free from any problem with the deterioration of the step coverage of the wiring layers formed in contact holes.

It is a still further object of the present invention to provide a novel method for fabricating a stacked capacitor

3 memory cell array device free from any problems as described above.

It is yet a further object of the present invention to provide a novel method for fabricating a stacked capacitor memory cell array device free from any problem with the deterioration of the step coverage of the inter-layer insulator.

It is still more object of the present invention to provide a novel method for fabricating a stacked capacitor memory cell array device free from any problem with the deterioration of the step coverage of the wiring layers formed in contact holes.

The above and other objects, features and advantages of the present invention will be apparent from the following descriptions.

The present invention provides a novel structure of a semiconductor memory device on a silicon substrate comprising: a first area on which stacked capacitor memory cells comprising top and bottom electrodes sandwiching a dielectric film are formed; a second area including at least a contact hole in which at least a wiring layer is formed; and a plurality of inter-layer insulators extending over both the first and second areas, wherein: the plurality of inter-layer insulators have two different total thickness between the first and second areas so that the total thickness on the first area is larger than that on the second area to thereby sufficiently reduce an aspect ratio of the at least a contact hole on the second area for allowing the wiring layer in the contact hole to have a good step coverage as well as allowing a top inter-layer insulator to have a gentle slope with a good step coverage at a boundary between the first and second areas.

The present invention also provides a method for forming an inter-layer insulator to be included in a semiconductor memory device comprising a first area on which stacked capacitor memory cells comprising top and bottom electrodes sandwiching a dielectric film are formed and a second area including at least a contact hole in which at least a wiring layer is formed, a plurality of inter-layer insulators extending over both the first and second areas, wherein the plurality of inter-layer insulators have two different total thickness between the first and second areas so that the total thickness on the first area is larger than that on the second area to thereby sufficiently reduce an aspect ratio of the at least a contact hole on the second area for allowing the wiring layer in the contact hole to have a good step coverage as well as allowing a top inter-layer insulator to have a gentle slope with a good step coverage at a boundary between the first and second areas, the method comprising the step of subjecting the inter-layer insulator only on the second area to a selective etching by using at least said top electrode of the stacked capacitors as a mask.

BRIEF DESCRIPTIONS OF THE DRAWINGS

Preferred embodiments of the present invention will be described in detail with reference to the accompanying drawings.

4

PREFERRED EMBODIMENTS

A first embodiment according to the present invention will be described with reference to FIGS. 2 to 7. The novel stacked capacitor memory cell array device comprises a stacked capacitor memory cell array area 110 and a peripheral area 100. The stacked capacitor memory cell array area 110 has stacked capacitor cells and field effect transistors as well as word lines and bit lines, in addition three inter-layer insulators for providing isolation of each elements thereof. The peripheral area 100 has word lines and bit lines as well as the inter-layer insulators. In the inter-layer insulators, one of which underlies a bottom electrode of the stacked capacitor has different two thickness wherein the thickness of the inter-layer insulator in the peripheral area 100 is smaller than the thickness of the inter-layer insulator in the stacked capacitor memory cell array area 110 so that the aspect ratio of the contact hole in the peripheral area 100 is dropped to prevent the wiring layer formed in the contact hole in the peripheral area 10 from any deterioration of the step coverage. At the boundary between the peripheral area 100 and the stacked capacitor memory cell array area 110, a slop of the top inter-layer insulator is gentle so that the top inter-layer insulator is permitted to be free from the deterioration of the step coverage.

The following descriptions will focus on the novel fabrication processes for fabricating the novel stacked capacitor memory cell array structure.

Figure 2:
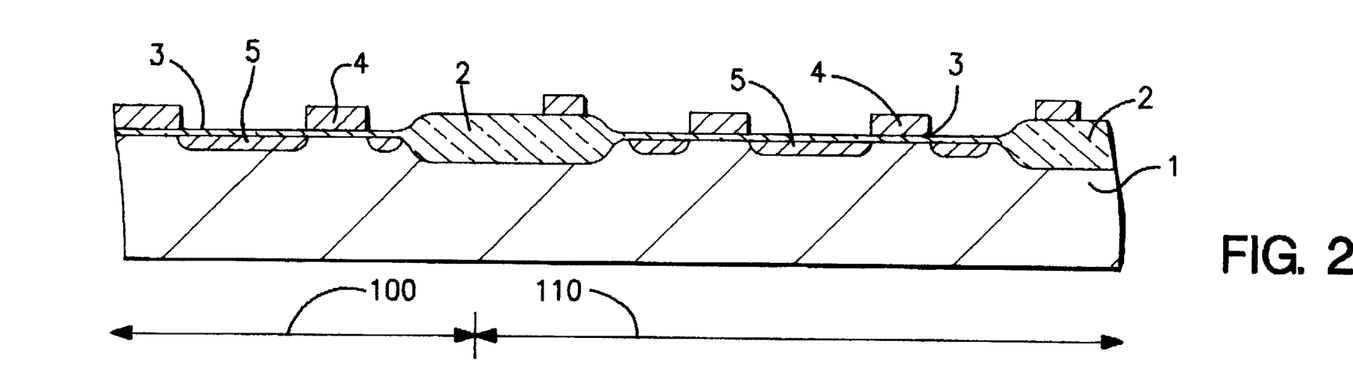
FIGS. 2 to 7 are fragmentary cross-sectional elevation views illustrative of novel stacked capacitor memory cell array structures in sequential processes involved in a fabrication method of a first embodiment according to the present invention.

With reference to FIG. 2, field oxide films 2 having a thickness in the range from 3000 to 5000 angstroms are selectively formed in a surface of a p-type silicon substrate 1. Gate oxide films 3 having a thickness in the range from 100 to 200 angstroms are formed on the surface of the silicon substrate 1. A first polysilicon layer having a thickness in the range from 2000 to 3000 angstroms is deposited on an entire surface of the device and subsequent patterning of the polysilicon layer to form first wiring lines 4. The first wiring lines 4 and the field oxide films 2 are used as masks for n-type impurity ion implantation such as phosphorus ion implantation to form n-type diffusion layers 5 in an upper region of the silicon substrate.

Figure 3:
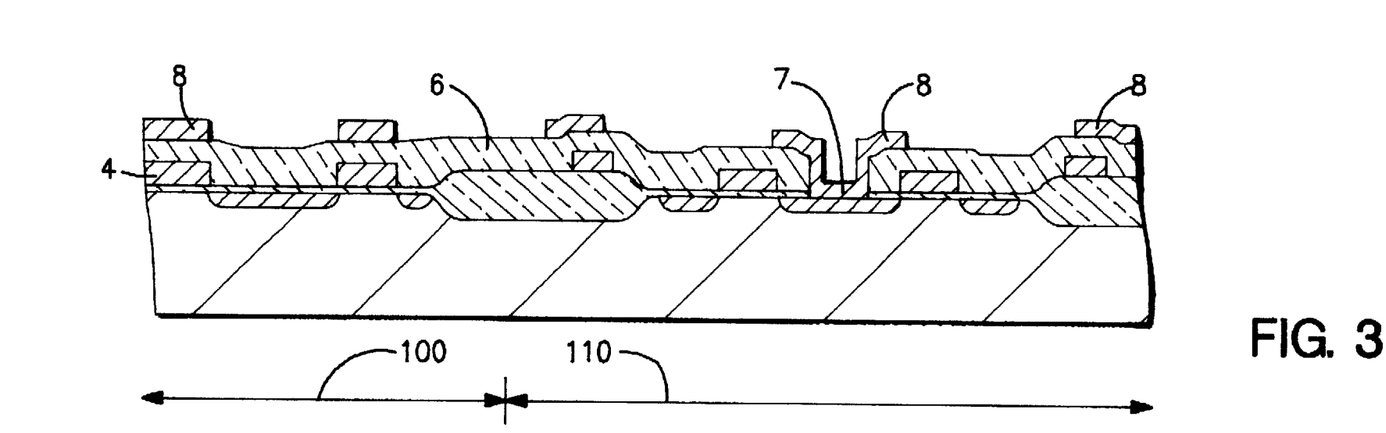

With reference to FIG. 3, a first inter-layer insulator 6 having a thickness in the range from 3000 to 4000 angstroms is formed on an entire surface of the device to cover the first wiring lines 4. A first contact hole 7 is formed through the first inter-layer insulator 6 and the gate oxide film 3 so that the first contact hole 7 is positioned over part of the n-type diffusion layers 5 whereby the part of the n-type diffusion layers 5 is exposed through the first contact hole 7. A tungsten silicide film having a thickness in the range from 2000 to 3000 angstroms is deposited by sputtering on an entire surface of the device for subsequent patterning of the tungsten silicide film to form second wiring lines 8.

Figure 4:
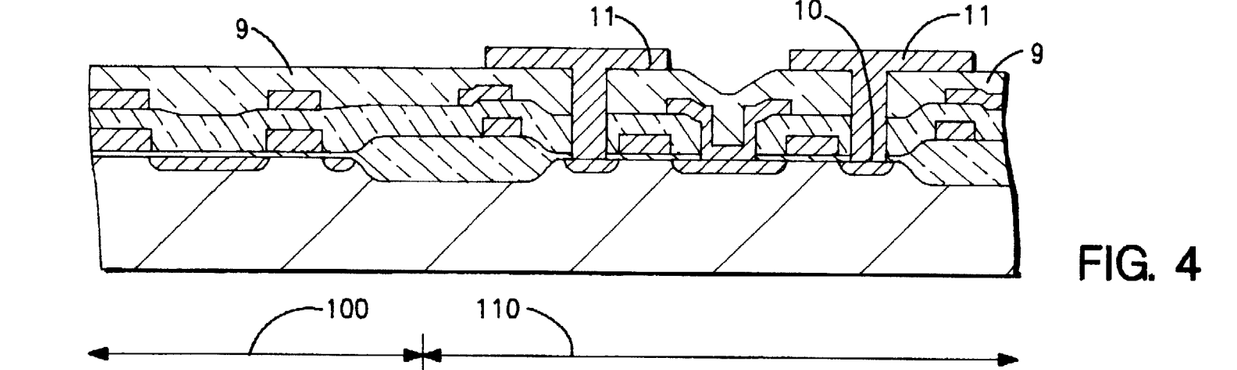

With reference to FIG. 4, a second inter-layer insulator 9 having a thickness in the range from 4000 to 5000 angstroms is formed on an entire surface of the device to cover the second wiring layers 8. Second contact holes 10 are formed to penetrate the first and second inter-layer insulators 6 and 9 wherein the second contact holes are formed just over the remaining part of the n-type diffusion layers 5 in the stacked capacitor memory cell array area 110 so that the remaining part of the n-type diffusion layers 5 is exposed through the second contact holes 10. A second polysilicon film 11 having a thickness in the range from 2000 to 3000 angstroms is deposited on an entire surface of the device so as to cover the second inter-layer insulator 9 as to well as fill the second contact holes 10 whereby the second polysilicon film within the second contact holes 10 makes contact with the n-type diffusion layers 5. The second polysilicon film is then patterned to form bottom electrodes 11 of stacked capacitors.

Figure 5:
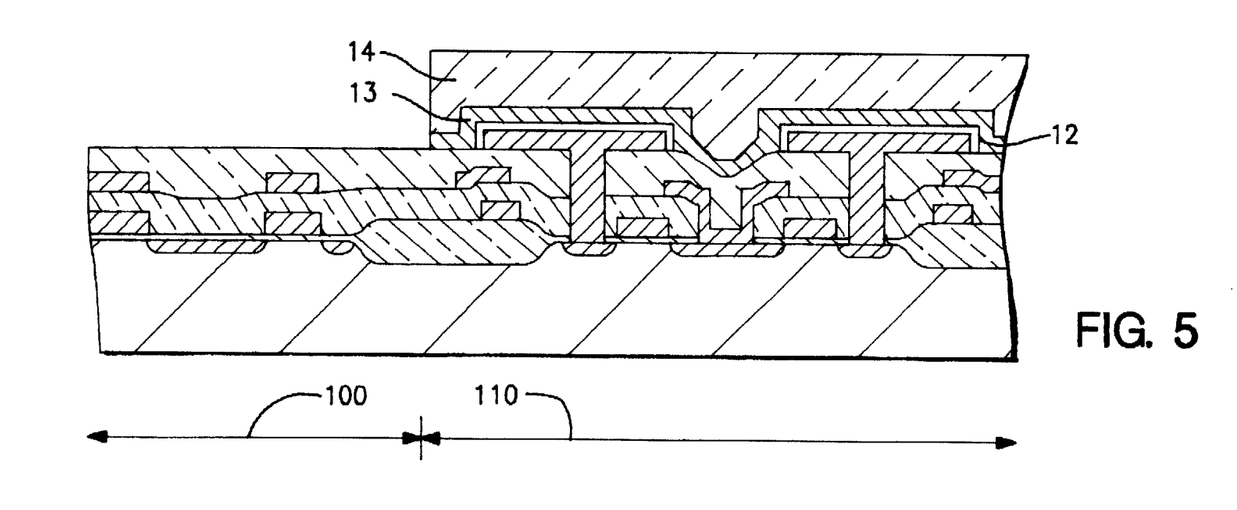

With reference to FIG. 5, a capacitive dielectric film 12 having such a thickness as to correspond to a silicon oxide film in the range of 60 to 80 angstroms is formed to cover the bottom electrodes 11 of the stacked capacitors. A third polysilicon film having a thickness in the range of 1000 to 2000 angstroms is deposited on an entire surface of the device, wherein the third polysilicon film extends over not only the stacked capacitor memory cell array are 110 but also the peripheral area 110. A photo-resist film 14 is applied on an entire surface of the third polysilicon film extending over the peripheral area 100 and the stacked capacitor memory cell array area 110. The photo-resist film is patterned to remove a part thereof on the peripheral area 100 and then form a photo-resist 14 only on the stacked capacitor memory cell array area 110. The photo-resist 14 is used as a mask for selective etching of the third polysilicon film 13 to form a top electrode 13 of the stacked capacitors, wherein the top electrode 13 extends over an entire part of the stacked capacitor memory cell array area 110 only. The top electrode 13 is a common top electrode for the plural stacked capacitors in the stacked capacitor memory cell array area 110.

Figure 6:
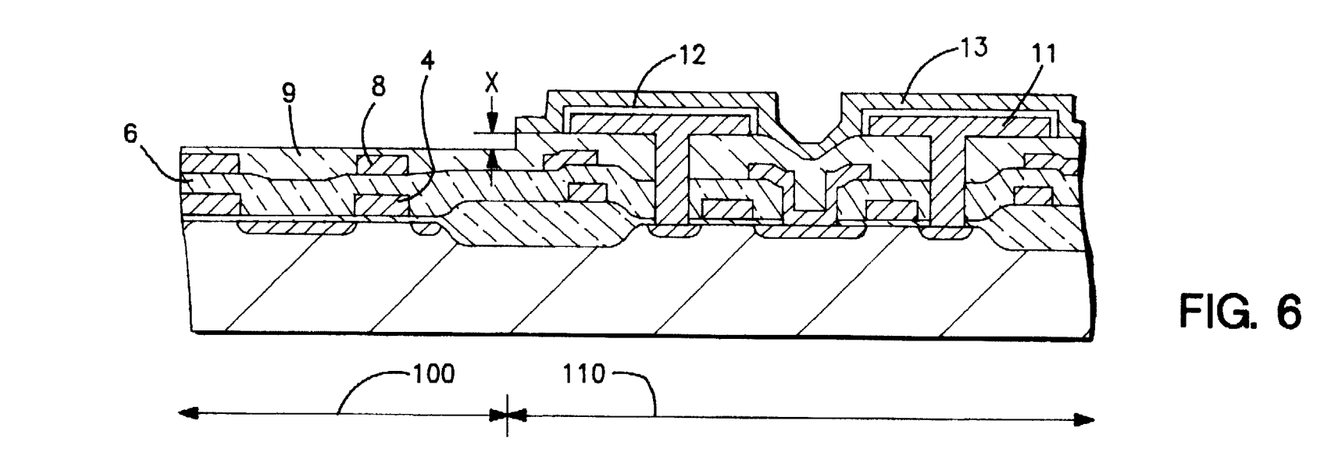

With reference to FIG. 6, the photo-resist 14 is also used as a mask for a selective etching of the second inter-layer insulator 9 only on the peripheral area 100. The etching of the second inter-layer insulator 9 is carried out at a predetermined depth "x". The etching depth associated with the second inter-layer insulator 9 is somewhat variable. Whereas it is preferable that the second wiring layers 8 on the peripheral area 100 are not exposed, it may also be possible that the second wiring layers 8 on the peripheral area 100 are exposed if a further inter-layer insulator is provided to cover the exposed second wiring layers 8. As a result of the selective etching of the second inter-layer insulator 9 using the photo-resist 14 as a mask, the second inter-layer insulator 9 is divided into two parts wherein a first part of the second inter-layer insulator 9 on the peripheral area 100 has a smaller thickness of approximately 2000 angstroms, while another part of the second inter-layer insulator 9 on the stacked capacitor memory cell array area 110 has the larger thickness in the range from 4000 to 5000 angstroms as described above. A difference in the thickness of the second inter-layer insulator 9 between on the peripheral area 100 and on the stacked capacitor memory cell array area 110 may preferably be in the range from 2000 to 3000 angstroms, namely the etching depth "x" may be set in the range from 2000 to 3000 angstroms. The photo-resist film 14 is removed.

Alternatively, the above selective etching of the second inter-layer insulator 9 on the peripheral area 100 may be carried out without use of the photo-resist 14 but by using the patterned top electrode 13 of the stacked capacitors as a mask, wherein the photo-resist 14 has already been removed.

Figure 7:
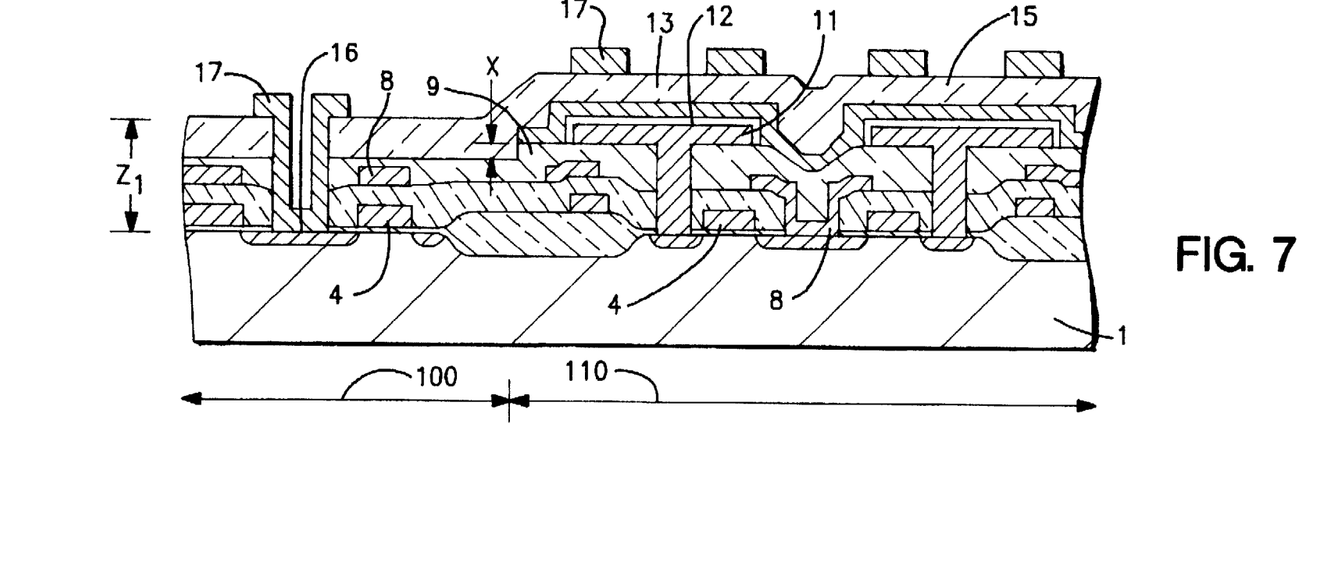

With reference to FIG. 7, a third inter-layer insulator 15 having a thickness in the range from 5000 to 6000 angstroms is formed on an entire surface of the device. The above described difference "x" in the thickness of the second inter-layer insulator 9 may permit the third inter-layer insulator 15 to have a gentle slope at the boundary between the peripheral area 100 and the stacked capacitor memory cell array area 110 wherein the gentle slope is sufficient for preventing the deterioration of the step coverage which leads to the disconnection of the third inter-layer insulator 15. A third contact hole 16 is formed to penetrate the gate oxide film 3 and the first to third inter-layer insulators 6, 9 and 15 wherein the third contact hole 16 is positioned just over the n-type diffusion layer on the peripheral area 100. Since the second inter-layer insulator 9 on the peripheral area 100 has the reduced thickness, the total thickness of the first to third inter-layer insulators 6, 9 and 15 is also reduced whereby a height of the third contact hole 16 is also reduced. The reduction in the height of the third contact hole 16 may result in a small aspect ratio of the third contact hole 16. An aluminum layer having a thickness in the range from 4000 to 5000 angstroms is deposited on an entire surface of the device by sputtering so that the aluminum layer is formed on the third inter-layer insulator 15 as well as within the third contact hole 16 wherein the aluminum layer within the third contact hole 16 is in contact with the diffusion layer 5 on the peripheral area 100. The deposited aluminum layer is then patterned to form third wiring layers 17.

The total thickness of the first to third inter-layer insulators 6, 9 and 15 on the stacked capacitor memory cell array area 110 would be in the range from 12000 to 14000 angstroms, while the total thickness of the first to third inter-layer insulators 6, 9 and 15 on the peripheral area 100 would be in the range from 9000 to 11000 angstroms. The aspect ratio of the third contact hole 16 of the novel device is reduced in the range of 1.5 to 1.8, while the aspect ratio of the third contact hole 16 of the conventional device is in the range of 2.0 to 2.3. The reduced aspect ratio of the third contact hole 16 of the novel device structure may permit the third wiring layer 17 within the third contact hole 16 to have a good step coverage.

From the above descriptions, it could be understood that the reduced thickness of the second inter-layer insulator 9 on the peripheral area 100 may permit the third wiring layer 17 within the third contact hole 16 to have the good step coverage due to the sufficiently small aspect ratio of the third contact hole 16 and simultaneously permit the third inter-layer insulator 15 to have a sufficient slope at the boundary between the peripheral area 100 and the stacked capacitor memory cell array area 110 for preventing the deterioration of the step coverage of the third inter-layer insulator 15.

Figure 8:
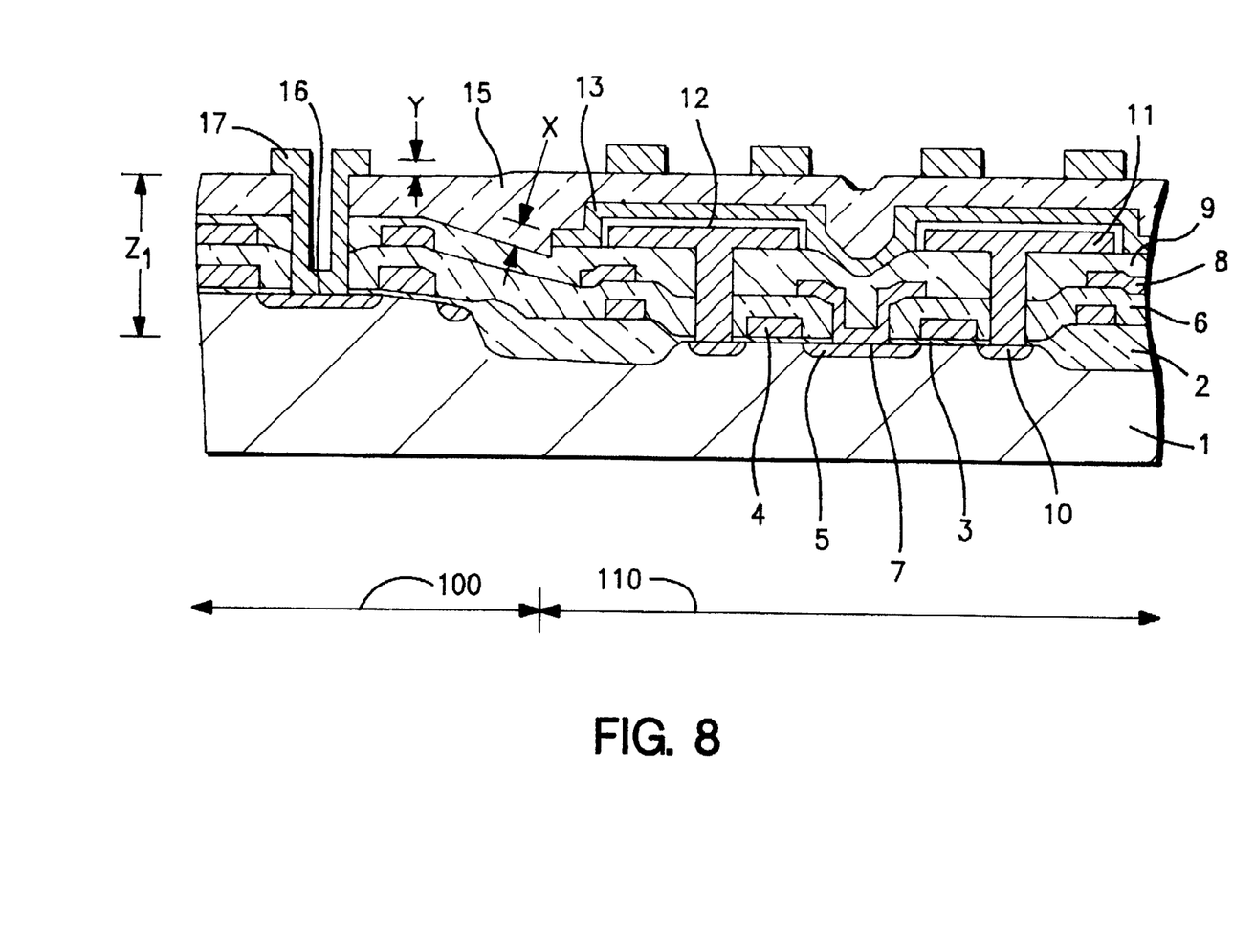
FIG. 8 is a fragmentary cross sectional elevation view illustrative of a novel stacked capacitor memory cell array structure in a second embodiment according to the present invention.

A second embodiment according to the present invention will be described with reference to FIG. 8, wherein a structural difference of the semiconductor device is in a p-type silicon substrate 1 which has a recessed portion on the stacked capacitor memory cell array area 110. The remaining structure of the device would be the same as the first embodiment. The provision of the recessed portion on the silicon substrate on the stacked capacitor memory cell array area 110 may allow a further reduction of the difference in level of the third inter-layer insulator 15 between the peripheral area 100 and the stacked capacitor memory cell array area 110 whereby the third inter-layer insulator 15 may have better step coverage than in the first embodiment.

The fabrication process of the novel semiconductor device in the second embodiment is as follows. A p-type silicon substrate 1 is formed with a recessed portion having a depth in the range from 3000 to 4000 angstroms only on the stacked capacitor memory cell array area 110. Field oxide films 2 having a thickness in the range from 3000 to 5000 angstroms are selectively formed in a surface of the recessed portion of the silicon substrate 1. Any subsequent processes of the second embodiment would be the same as the first embodiment.

Gate oxide films 3 having a thickness in the range from 100 to 200 angstroms are formed on the surface of the silicon substrate 1. A first polysilicon layer having a thickness in the range from 2000 to 3000 angstroms is deposited on an entire surface of the device and subsequent patterning of the polysilicon layer to form first wiring lines 4. The first wiring lines 4 and the field oxide films 2 are used as masks for n-type impurity ion implantation such as phosphorus ion implantation to form n-type diffusion layers 5 in an upper region of the silicon substrate.

A first inter-layer insulator 6 having a thickness in the range from 3000 to 4000 angstroms is formed on an entire surface of the device to cover the first wiring lines 4. A first contact hole 7 is formed through the first inter-layer insulator 6 and the gate oxide film 3 so that the first contact hole 7 is positioned over part of the n-type diffusion layers 5 whereby the part of the n-type diffusion layers 5 is exposed through the first contact hole 7. A tungsten silicide film having a thickness in the range from 2000 to 3000 angstroms is deposited by sputtering on an entire surface of the device for subsequent patterning of the tungsten silicide film to form second wiring lines 8.

A second inter-layer insulator 9 having a thickness in the range from 4000 to 5000 angstroms is formed on an entire surface of the device to cover the second wiring layers 8. Second contact holes 10 are formed to penetrate the first and second inter-layer insulators 6 and 9 wherein the second contact holes are formed just over the remaining part of the n-type diffusion layers 5 in the stacked capacitor memory cell array area 110 so that the remaining part of the n-type diffusion layers 5 is exposed through the second contact holes 10. A second polysilicon film 11 having a thickness in the range from 2000 to 3000 angstroms is deposited on an entire surface of the device so as to cover the second inter-layer insulator 9 as well as to fill the second contact holes 10 whereby the second polysilicon film within the second contact holes 10 makes contact with the n-type diffusion layers 5. The second polysilicon film is then patterned to form bottom electrodes 11 of stacked capacitors.

A capacitive dielectric film 12 having such a thickness as to correspond to a silicon oxide film in the range of 60 to 80 angstroms is formed to cover the bottom electrodes 11 of the stacked capacitors. A third polysilicon film having a thickness in the range of 1000 to 2000 angstroms is deposited on an entire surface of the device, wherein the third polysilicon film extends over not only the stacked capacitor memory cell array area 110 but also the peripheral area 110. A photo-resist film 14 is applied on an entire surface of the third polysilicon film extending over the peripheral area 100 and the stacked capacitor memory cell array area 110. The photo-resist film is patterned to remove a part thereof on the peripheral area 100 and then form a photo-resist 14 only on the stacked capacitor memory cell array area 110. The photo-resist 14 is used as a mask for selective etching of the third polysilicon film 13 to form a top electrode 13 of the stacked capacitors, wherein the top electrode 13 extends over an entire part of the stacked capacitor memory cell array area 110 only. The top electrode 13 is a common top electrode for the plural stacked capacitors in the stacked capacitor memory cell array area 110.

The photo-resist 14 is also used as a mask for a selective etching of the second inter-layer insulator 9 only on the peripheral area 100. The etching of the second inter-layer insulator 9 is carried out at a predetermined depth "x". The etching depth associated with the second inter-layer insulator 9 is somewhat variable. Whereas it is preferable that the second wiring layers 8 on the peripheral area 100 are not exposed, it may also be possible that the second wiring layers 8 on the peripheral area 100 are exposed if a further inter-layer insulator is provided to cover the exposed second wiring layers 8. As a result of the selective etching of the second inter-layer insulator 9 using the photo-resist 14 as a mask, the second inter-layer insulator 9 is divided into two parts wherein a first part of the second inter-layer insulator 9 on the peripheral area 100 has a smaller thickness of approximately 2000 angstroms, while another part of the second inter-layer insulator 9 on the stacked capacitor memory cell array area 110 has a larger thickness in the range from 4000 to 5000 angstroms as described above. A difference in the thickness of the second inter-layer insulator 9 between on the peripheral area 100 and on the stacked capacitor memory cell array area 110 may preferably be in the range from 2000 to 3000 angstroms, namely the etching depth "x" may be set in the range from 2000 to 3000 angstroms. The photo-resist film 14 is removed.

Alternatively, the above selective etching of the second inter-layer insulator 9 on the peripheral area 100 may be carried out without use of the photo-resist 14 but by using the patterned top electrode 13 of the stacked capacitors as a mask, wherein the photo-resist 14 has already been removed.

A third inter-layer insulator 15 having a thickness in the range from 5000 to 6000 angstroms is formed on an entire surface of the device. The above described difference "x" in the thickness of the second inter-layer insulator 9 may permit the third inter-layer insulator 15 to have a gentle slope at the boundary between the peripheral area 100 and the stacked capacitor memory cell array area 110 wherein the gentle slope is sufficient for preventing the deterioration of the step coverage which leads to the disconnection of the third inter-layer insulator 15. A third contact hole 16 is formed to penetrate the gate oxide film 3 and the first to third inter-layer insulators 6, 9 and 15 wherein the third contact hole 16 is positioned just over the n-type diffusion layer on the peripheral area 100. Since the second inter-layer insulator 9 on the peripheral area 100 has the reduced thickness, the total thickness of the first to third inter-layer insulators 6, 9 and 15 is also reduced whereby a height of the third contact hole 16 is also reduced. The reduction in the height of the third contact hole 16 may result in a small aspect ratio of the third contact hole 16. An aluminum layer having a thickness in the range from 4000 to 5000 angstroms is deposited on an entire surface of the device by sputtering so that the aluminum layer is formed on the third inter-layer insulator 15 as well as within the third contact hole 16 wherein the aluminum layer within the third contact hole 16 is in contact with the diffusion layer 5 on the peripheral area 100. The deposited aluminum layer is then patterned to form third wiring layers 17.

The total thickness of the first to third inter-layer insulators 6, 9 and 15 on the stacked capacitor memory cell array area 110 would be in the range from 12000 to 14000 angstroms, while the total thickness of the first to third inter-layer insulators 6, 9 and 15 on the peripheral area 100 would be in the range from 9000 to 11000 angstroms. The aspect ratio of the third contact hole 16 of the novel device is reduced to the range of 1.5 to 1.8, while the aspect ratio of the third contact hole 16 of the conventional device is in the range of 2.0 to 2.3. The reduced aspect ratio of the third contact hole 16 of the novel device structure may permit the third wiring layer 17 within the third contact hole 16 to have a good step coverage.

From the above descriptions, it could be understood that the reduced thickness of the second inter-layer insulator 9 on the peripheral area 100 may permit the third wiring layer 17 within the third contact hole 16 to have the good step coverage due to the sufficiently small aspect ratio of the third contact hole 16 and simultanously permit the third inter-layer insulator 15 to have a sufficient slope at the boundary between the peripheral area 100 and the stacked capacitor memory cell array area 110 for preventing the deterioration of the step coverage of the third inter-layer insulator 15.

The provision of the recessed portion of the silicon substrate 1 may permit a further reduction in the difference in level of the third inter-layer insulator 15 between the peripheral area 100 and the stacked capacitor memory cell array area 110 whereby the step coverage of the third inter-layer insulator 15 is considerably improved.

Whereas modifications of the present invention will no doubt be apparent to a person having ordinary skill in the art, to which the invention pertains, it is to be understood that embodiments shown and described by way of illustrations are by no means intended to be considered in a limiting sense. Accordingly, it is to be intended to cover by claims all modifications of the present invention which fall within the sprite and scope of the person invention.

What is claimed is:

1. A semiconductor memory device comprising:

a silicon substrate;

a first area of said substrate including stacked capacitor memory cells comprising top and bottom electrodes sandwiching a dielectric film;

a second area of said substrate including a contact hole in which at least a wiring layer is formed; and a plurality of inter-layer insulators extending over both of said first and second areas, said plurality of inter-layer insulators having a total thickness over said first area larger than a total thickness of said plurality of inter-layer insulators over said second area, said silicon substrate being recessed by a range of 3000 to 4000 angstroms in a portion of said first area to reduce a difference in surface level of a top one of said plurality of inter-layer insulators between said first and second areas, thereby reducing an aspect ratio of the contact hole on the second area to a range of 1.5 to 1.8 for allowing the wiring layer in the contact hole to have a good step coverage as well as allowing the top inter-layer insulator to have a gentle slope with a good step coverage at a boundary between the first and second areas.

2. The device as claimed in claim 1, wherein the total thickness on the first area is in the range from 12000 to 14000 angstroms and the total thickness on the second area is in the range from 9000–11000 angstroms.

3. The device as claimed in claim 1, wherein only one of the plurality of inter-layer insulators, which is positioned just under said bottom electrodes, has two different thicknesses between said first and second areas so that the thickness on said first area is larger than the thickness on said second area by 2000 to 3000 angstroms.

4. A semiconductor memory device comprising:

a substrate including a memory cell area having stacked capacitor memory cells and a peripheral circuit area of said substrate having a contact hole with a wiring layer therein, a surface of said memory cell area being recessed relative to a surface of said peripheral circuit area; and a plurality of inter-layer insulators extending over both said memory cell area and said peripheral circuit area, a thickness of said plurality of inter-layer insulators over said memory cell area being greater than the thickness of said plurality of inter-layer insulators over said peripheral circuit area, an intermediate one of said plurality of inter-layer insulators having a sufficiently lower thickness on said peripheral circuit area than on said memory cell area to reduce an aspect ratio of said contact hole to a range of 1.5 to 1.8 for allowing said wiring layer in said contact hole to have a good step coverage;

wherein said memory cell area is sufficiently recessed so that a top one of said plurality of inter-layer insulators is substantially planar across a boundary between said memory cell are and said peripheral circuit area.

* * * * *